(12) United States Patent
Ahmadi et al.

(10) Patent No.: US 11,686,907 B2
(45) Date of Patent: Jun. 27, 2023

(54) THERMAL INTERFACE FOR RIDING HEATSINK

(71) Applicant: Lumentum Operations LLC, San Jose, CA (US)

(72) Inventors: Roozbeh Ahmadi, Ottawa (CA); Thomas Haslam, Ottawa (CA); Shane H. Woodside, Ottawa (CA)

(73) Assignee: Lumentum Operations LLC, San Jose, CA (US)

( * ) Notice: Subject to any disclaimer, the term of this patent is extended or adjusted under 35 U.S.C. 154(b) by 0 days.

(21) Appl. No.: 17/812,812

(22) Filed: Jul. 15, 2022

(65) Prior Publication Data

US 2022/0350098 A1    Nov. 3, 2022

Related U.S. Application Data (63) Continuation of application No. 16/266,817, filed on Feb. 4, 2019, now Pat. No. 11,391,899.

(60) Provisional application No. 62/627,544, filed on Feb. 7, 2018.

(51) Int. Cl.
| | | |
|---|---|---|
| *G02B 6/42* | (2006.01) | |
| *H05K 7/20* | (2006.01) | |
| *B32B 27/06* | (2006.01) | |

(52) U.S. Cl.
CPC ....... *G02B 6/4269* (2013.01); *H05K 7/20409* (2013.01); *B32B 27/06* (2013.01); *H05K 2201/066* (2013.01); *H05K 2201/10121* (2013.01); *H05K 2201/10962* (2013.01)

(58) Field of Classification Search
None
See application file for complete search history.

(56) References Cited

U.S. PATENT DOCUMENTS

| | | | |
|---|---|---|---|
| 9,474,188 B2 | 10/2016 | Moore | |
| 10,690,868 B1 | 6/2020 | Goergen et al. | |
| 10,791,652 B2* | 9/2020 | Thompson | H05K 7/20509 |
| 11,391,899 B2 | 7/2022 | Ahmadi et al. | |
| 2005/0035896 A1 | 2/2005 | Fujieda et al. | |
| 2011/0198653 A1 | 8/2011 | Cho | |
| 2014/0161408 A1 | 6/2014 | Aoki | |
| 2014/0321061 A1 | 10/2014 | Moore et al. | |
| 2018/0095228 A1 | 4/2018 | Rosenberg et al. | |
| 2020/0388548 A1 | 12/2020 | Blackburn et al. | |
| 2021/0013653 A1 | 1/2021 | Sasaki et al. | |

OTHER PUBLICATIONS

Kulr., "Thermal Interface Material," May 23, 2016, 4 pages. Retrieved from the Internet: [URL:http://kurltechnology.com/thermal-interface-material].

* cited by examiner

*Primary Examiner* — Michael Lebentritt
(74) *Attorney, Agent, or Firm* — Harrity & Harrity, LLP (57) ABSTRACT

A pluggable optical module may include a substrate. The pluggable optical module may include a compressible sliding thermal interface disposed on the substrate to contact a riding heatsink. The compressible sliding thermal interface material may be compressed to fill interstices between a first surface of the substrate and a second surface of the riding heatsink. The compressible sliding thermal interface may protrude from the first surface of the substrate such that insertion of the pluggable optical module into a cage compresses the compressible sliding thermal interface to achieve a threshold thermal boundary resistance.

20 Claims, 7 Drawing Sheets

THERMAL INTERFACE FOR RIDING HEATSINK

RELATED APPLICATION(S)

This application is a continuation of U.S. patent application Ser. No. 16/266,817, filed Feb. 4, 2019 (now U.S. Pat. No. 11,391,899), which claims priority under 35 U.S.C. § 119 to U.S. Provisional Patent Application No. 62/627,544, filed on Feb. 7, 2018, the contents of which are incorporated herein by reference in their entireties.

TECHNICAL FIELD

The present disclosure relates to thermal interfaces. More particularly, some aspects of the present disclosure relate to a compressible sliding thermal interface for a riding heatsink disposed in proximity to and/or contacting a pluggable optical module.

BACKGROUND

Pluggable optical modules, such as pluggable transceivers, may include multiple internal components to enable high-speed communications in an optical communications system. For example, a pluggable optical module may include a digital signal processor (DSP), a transmitter optical subassembly (TOSA), a receiver optical subassembly (ROSA), a transmitter/receiver optical subassembly (TROSA), electronics associated therewith, and/or the like. A housing of a pluggable optical module may be coupled to a riding heatsink of a cage to provide heat-dissipation capacity for the pluggable optical module. The pluggable optical module may be plugged into the cage, which couples the pluggable optical module to the riding heatsink. The cage may contain increasing quantities of pluggable optical modules to achieve increasing bandwidth for optical communications. With increasing quantities of high-speed components and with increasing miniaturization of pluggable optical modules and electro-optical components disposed therein to enable a greater density of pluggable optical modules in a single cage, improving heat-dissipation performance is desirable.

SUMMARY

According to some possible implementations, a device may include a pluggable optical module. The pluggable optical module may include a substrate. The pluggable optical module may include a compressible sliding thermal interface material disposed on the substrate, wherein the compressible sliding thermal interface material is compressed by a threshold clamping force to fill interstices between a first surface of the substrate and a second surface of a riding heatsink, and wherein the compressible sliding thermal interface protrudes from the first surface of the substrate such that insertion of the pluggable optical module into a cage that includes the riding heatsink compresses the compressible sliding thermal interface by the threshold clamping force to achieve a threshold thermal boundary resistance.

According to some possible implementations, a pluggable optical module may include a substrate. The pluggable optical module may include a compressible sliding thermal interface disposed on the substrate to contact a riding heatsink, wherein the compressible sliding thermal interface material is compressed to fill interstices between a first surface of the substrate and a second surface of the riding heatsink, and wherein the compressible sliding thermal interface protrudes from the first surface of the substrate such that insertion of the pluggable optical module into a cage compresses the compressible sliding thermal interface to achieve a threshold thermal boundary resistance between the pluggable optical module and the riding heatsink.

According to some possible implementations, an electro-optic transceiver may include a substrate for inserting into a cage. The electro-optic transceiver may include an interface material disposed on the substrate, wherein the interface material is compressible to enable insertion of the substrate into the cage, wherein the interface material extends above a surface of the substrate, and wherein the interface material is thermally conductive and is associated with a threshold thermal boundary resistance at a threshold clamping force.

DETAILED DESCRIPTION

The following detailed description of example implementations refers to the accompanying drawings. The same reference numbers in different drawings may identify the same or similar elements.

A riding heatsink may be clamped to a housing of a pluggable optical module to enable the riding heatsink to improve a heat dissipation capacity of the pluggable optical module. However, insufficient amounts of clamping force applied by a cage to the pluggable optical module when the pluggable optical module is inserted into the cage may result in the riding heatsink failing to achieve a threshold level of heat dissipation capacity for the pluggable optical module. Further, respective surfaces of the riding heatsink and the pluggable optical module may be relatively rough, which may result in air-filled interstices between the housing of the pluggable optical module and the riding heatsink when there is a metal-on-metal contact between the respective surfaces of the riding heatsink and the pluggable optical module. For example, the air-filled interstices of the metal-on-metal contact may provide an insulating barrier, thereby negatively impacting an achievable thermal boundary resistance.

Some implementations described herein enable increased clamping force by disposing a compressible sliding thermal interface between the riding heatsink and a housing of a pluggable optical module. For example, the compressible sliding thermal interface may be disposed in a depression of a substrate of the housing such that the compressible sliding thermal interface protrudes above a surface of the housing. In this case, when the pluggable optical module is plugged into a cage, the compressible sliding thermal interface increases a clamping force between the riding heatsink and the housing of the pluggable optical module relative to a metal-on-metal contact between the riding heatsink and the housing of the pluggable optical module. Based on increasing the clamping force, a threshold level of clamping force may be achieved, which may achieve a threshold thermal boundary resistance, thereby improving heat dissipation capacity of the riding heatsink for the pluggable optical module.

Moreover, based on compressing the compressible sliding thermal interface, the compressible sliding thermal interface may fill interstices between the housing and the riding heatsink (e.g., air gaps), thereby increasing thermal conductivity between the pluggable optical module and the riding heatsink. Furthermore, based on using a slidable thermal interface material, the compressible sliding thermal interface material may be relatively durable, thereby reducing a necessity of frequent replacements to the compressible sliding thermal interface material relative to using a non-slidable thermal interface material.

Figure 1A:
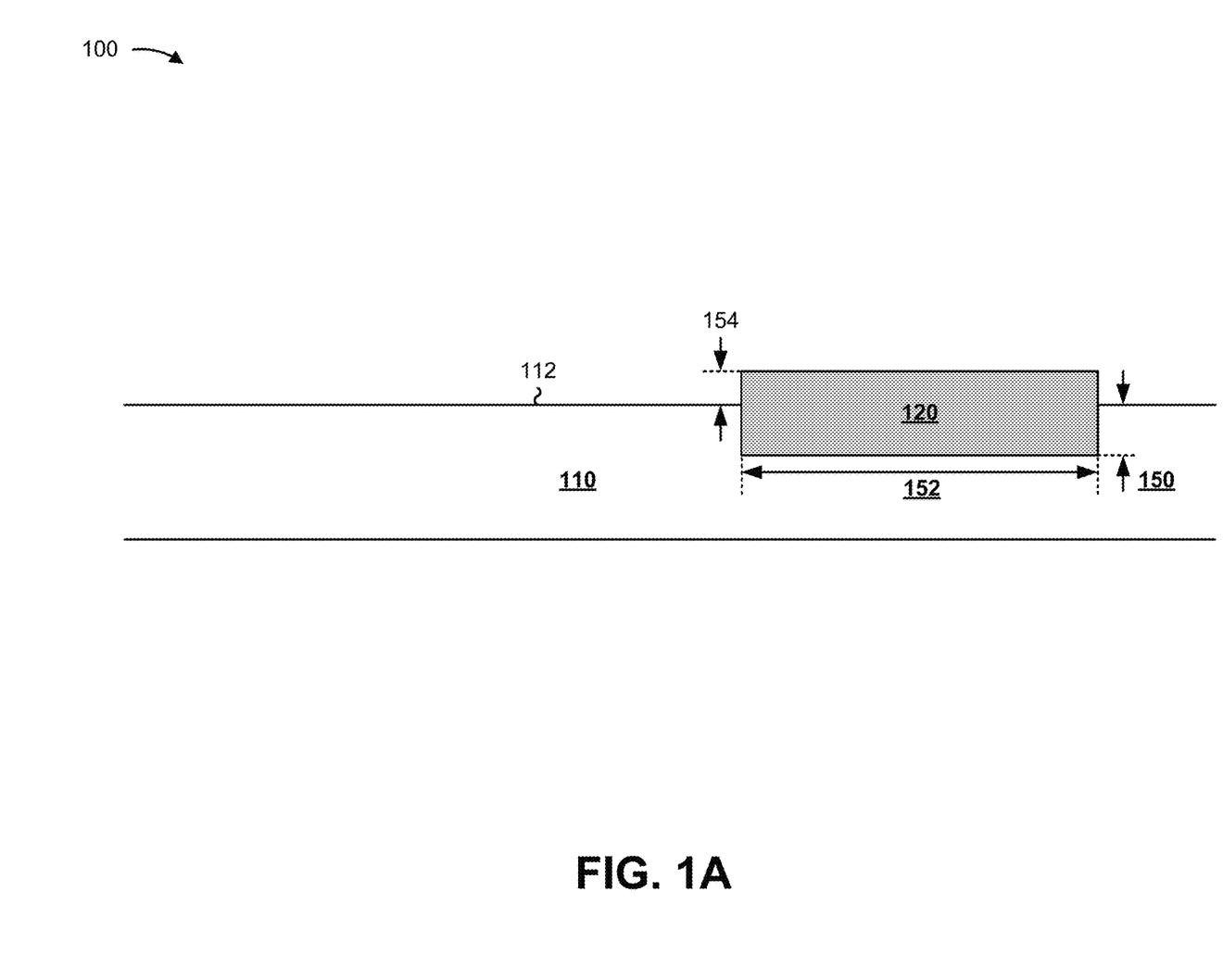
FIGS. 1A and 1B are diagrams of an overview of an example implementation described herein.
Figure 1B:
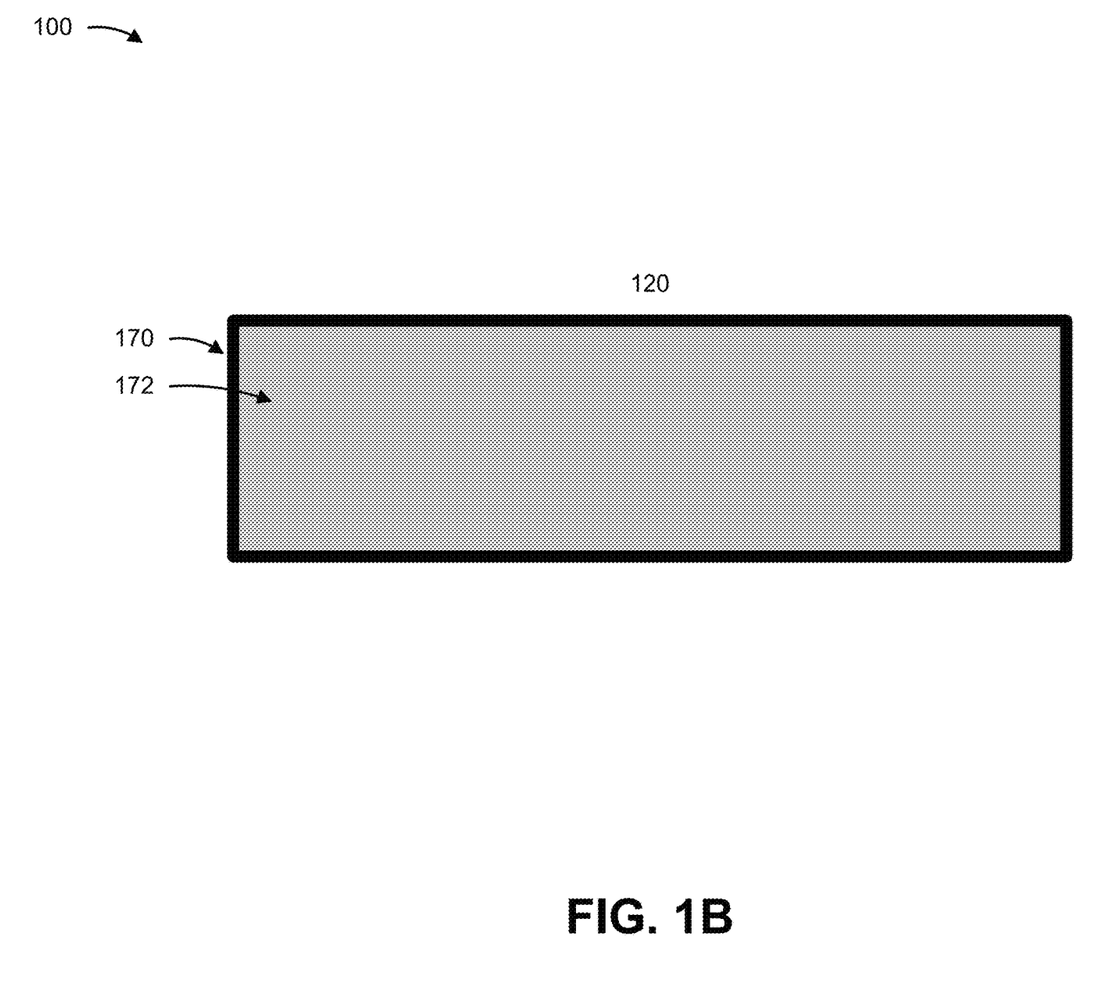

FIGS. 1A and 1B are diagrams of an overview of an example implementation 100 described herein. As shown in FIG. 1A, example implementation 100 may include a substrate 110 and a compressible sliding thermal interface 120. In some implementations, substrate 110 may be a surface of a pluggable optical module. For example, substrate 110 may be a housing of the pluggable optical module, which may include one or more electrical components, optical components, electro-optical components, and/or the like. In some implementations, the pluggable optical module may be a pluggable transceiver. In some implementations, substrate 110 may be a surface of an active optical module, a passive optical module, and/or the like. In some implementations, substrate 110 may be a surface of a wavelength selective switch, an amplifier, a transmitter, a receiver, a digital signal processor, and/or the like. In some implementations, compressible sliding thermal interface 120 is applied (e.g., during manufacture) to substrate 110, and a riding heatsink is disposed (e.g., as a result of assembly) onto compressible sliding thermal interface 120 and substrate 110. In some implementations, compressible sliding thermal interface 120 is applied to the riding heatsink, and compressible sliding thermal interface 120 and the riding heatsink are disposed onto substrate 110. In this case, the riding heatsink may include a depression to receive compressible sliding thermal interface 120 rather than substrate 110.

As further shown in FIG. 1A, compressible sliding thermal interface 120 may be disposed into a depression in substrate 110. For example, substrate 110 may include a depression with a depth 150 and a width 152. In some implementations, depth 150 may be approximately 500 micrometers (μm). In some implementations, depth 150 may be between approximately 100 μm and 2000 μm. In some implementations, width 152 may be approximately 20 millimeters (mm). In some implementations, width 152 may be between approximately 5 mm and 50 mm.

In some implementations, a particular amount of compressible sliding thermal interface 120 may be disposed into the depression in substrate 110, such that compressible sliding thermal interface 120 protrudes above surface 112 of substrate 110 by height 154. In some implementations, height 154 may be approximately 100 μm. In some implementations, height 154 may be between approximately 0 μm and 100 μm. In this way, based on compressible sliding thermal interface 120 protruding above surface 112 by height 154, compressible sliding thermal interface 120 is compressed with a threshold clamping force when substrate 110 (e.g., when a pluggable optical module including substrate 110) is inserted into a cage. Moreover, based on height 154 being less than approximately 100 μm, compressible sliding thermal interface 120 is configured to not interfere with insertion of a pluggable optical module into a cage. In some implementations, compressible sliding thermal interface 120 may be a compliant material.

As shown in FIG. 1B, compressible sliding thermal interface 120 may be defined by an outer surface 170 (e.g., a flexible interface structure) enclosing an inner body 172, which may be an interface filling material. In some implementations, compressible sliding thermal interface 120 may be a fluid compressible sliding thermal interface 120. For example, inner body 172 may be a compressible, slidable, conductive fluid, and outer surface 170 may be an encapsulation material surrounding the compressible, slidable, conductive fluid. In this case, inner body 172 may be a conductive liquid and outer surface 170 may be a metal enclosure enclosing the conductive liquid. In some implementations, outer surface 170 may be a flexible support structure. For example, outer surface 170 may include one or more inner members forming a composite structure of structural cells, inner supports, flexible structural compartments, and/or the like. Additionally, or alternatively, inner body 172 may be a conductive gas or plasma enclosed by outer surface 170.

In some implementations, outer surface 170 may be a surface of a material comprising inner body 172. For example, when inner body 172 is a viscous liquid, outer surface 170 may be a surface of the viscous liquid rather than a separate encapsulation material containing the viscous liquid. In some implementations, compressible sliding thermal interface 120 may be a carbon nano-tube material or carbon fiber material. In some implementations, compressible sliding thermal interface 120 may be a thermal grease. In this way, by encapsulating a fluid material of inner body 172 inside a structure formed by outer surface 170, compressible sliding thermal interface 120 enables insertion of a pluggable optical module into a cage without portions of compressible sliding thermal interface 120 being dispersed or dislodged.

Although some implementations are described herein in terms of an interface material disposed between a pluggable optical module and a riding heatsink, other implementations are possible. For example, compressible sliding thermal interface 120 may be disposed on a substrate 110 of another type of pluggable electro-optic transceiver, and may be sandwiched between the pluggable electro-optic transceiver and another type of component to achieve less than a threshold thermal boundary resistance, as described herein. Similarly, compressible sliding thermal interface 120 may be disposed on another portion of a pluggable optical module, such as between a surface of the pluggable optical module and a digital signal processor disposed in the pluggable optical module.

As indicated above, FIGS. 1A and 1B are provided merely as one or more examples. Other examples may differ from what is described with regard to FIGS. 1A and 1B.

FIGS. 2A-2D are diagrams of an example implementation 200 described herein.

Figure 2A:
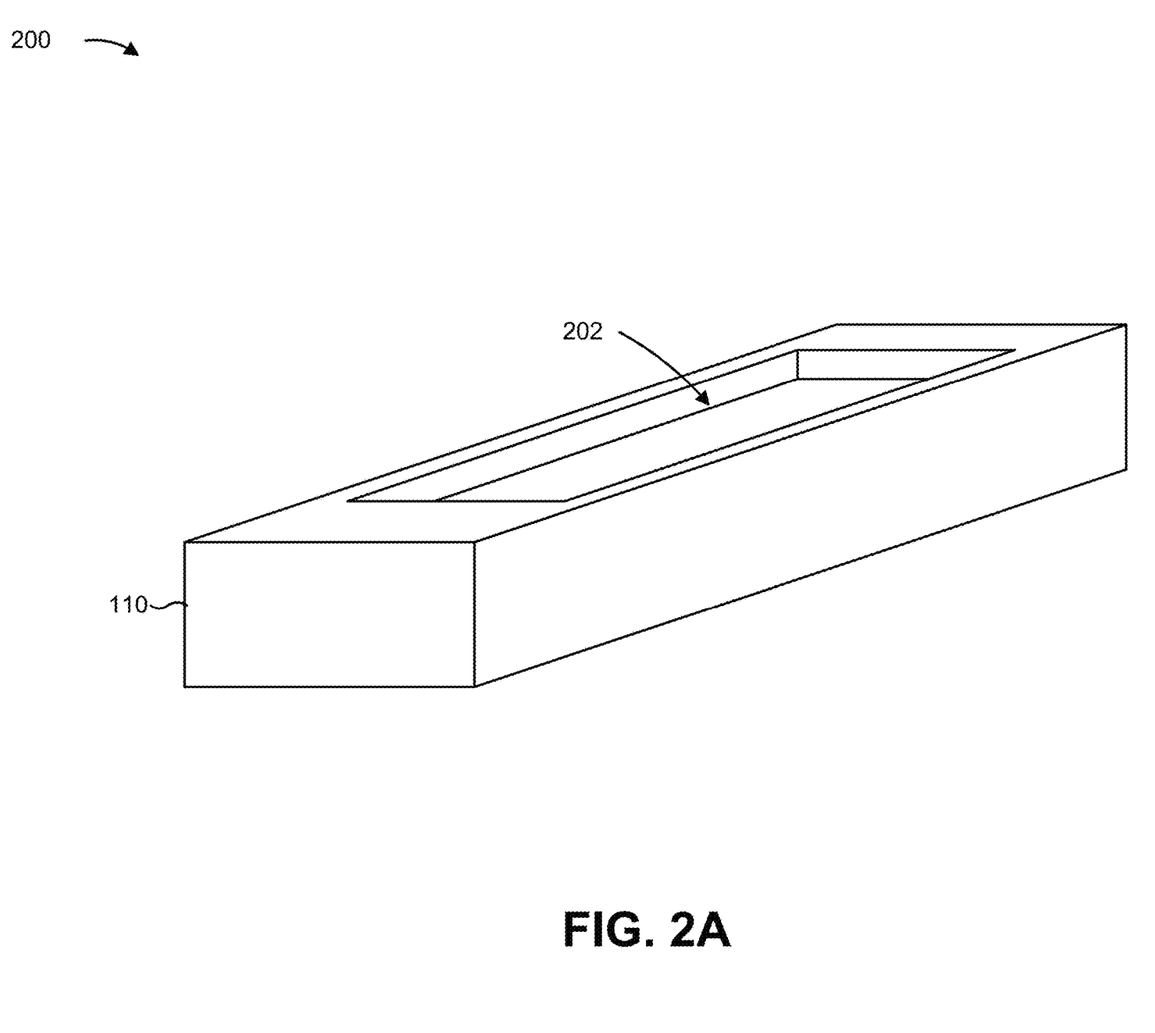
FIGS. 2A-2D are diagrams of an example implementation described herein.

As shown in FIG. 2A, example implementation 200 includes substrate 110 with a cavity 202.

Figure 2B:
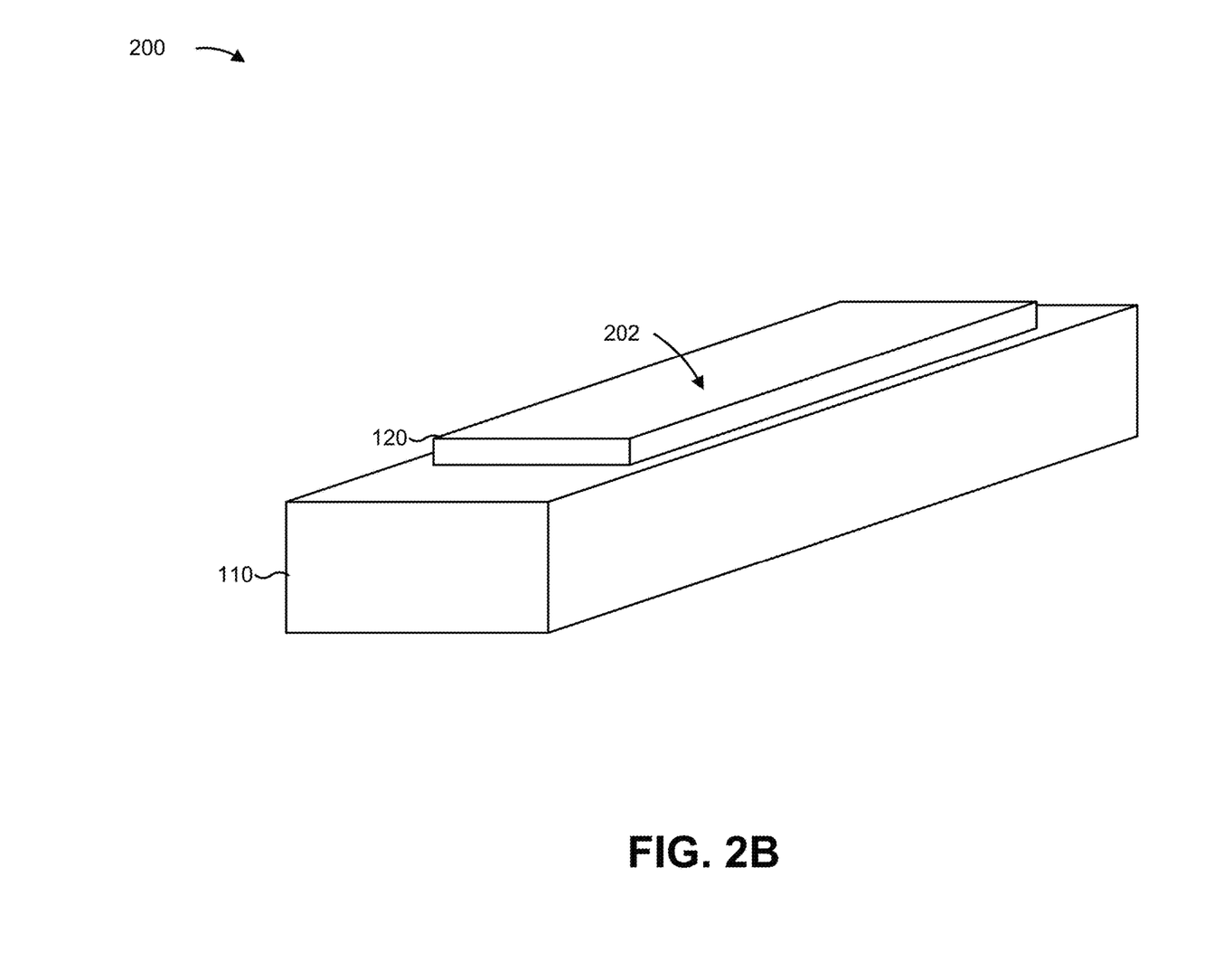

As shown in FIG. 2B, a compressible sliding thermal interface 120 may be disposed into cavity 202 to fill cavity 202. In some implementations, substrate 110 may not include a cavity 202, and compressible sliding thermal interface 120 may be disposed onto a surface of substrate 110 rather than in a cavity 202.

Figure 2C:
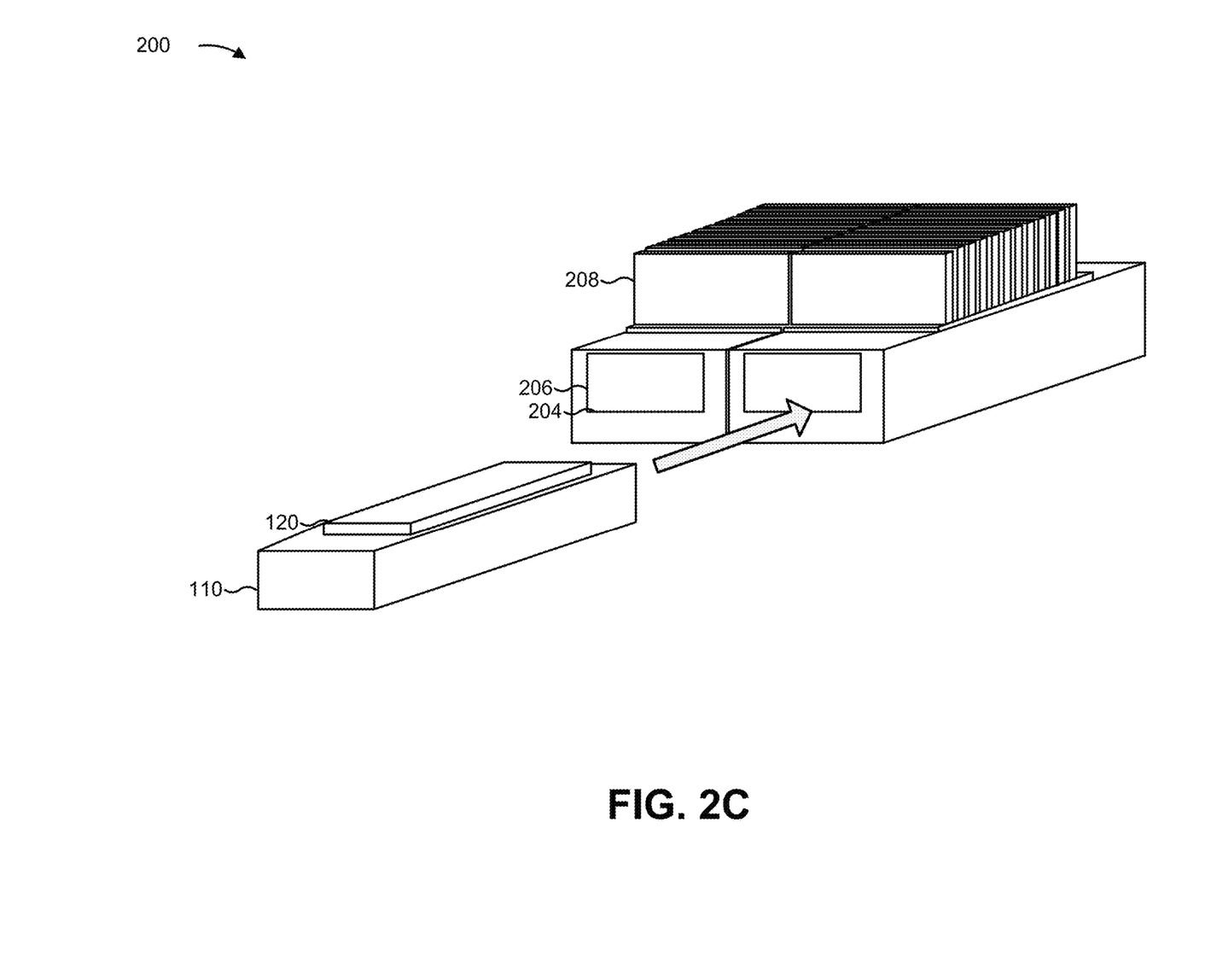

As shown in FIG. 2C, substrate 110 with compressible sliding thermal interface 120 may be aligned to an opening 204 of cage 206, which may include a riding heatsink 208 attached to a surface of cage 206. In some implementations, cage 206 may include multiple openings 204 to receive multiple pluggable electro-optic transceivers, such as substrate 110, and may include multiple riding heatsinks 208 to provide heat dissipation for the multiple pluggable electro-optic transceivers. In some implementations, riding heatsinks 208 may be disposed on top of cage 206. In some implementations, riding heatsinks 208 may be recessed into a top of cage 206 and/or may form a top of cage 206 or a section of the top of cage 206.

Figure 2D:
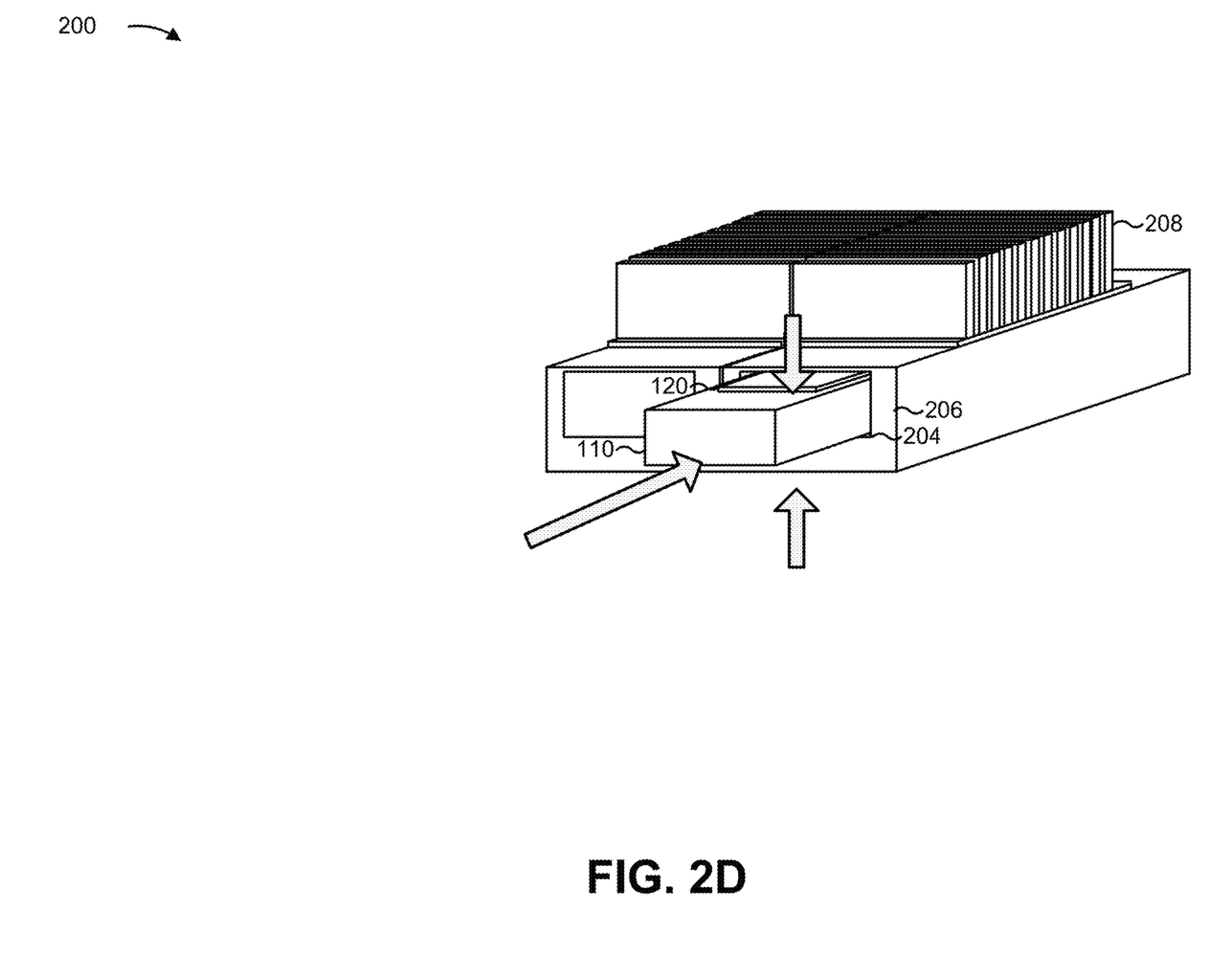

As shown in FIG. 2D, substrate 110 and compressible sliding thermal interface 120 are inserted into opening 204 of cage 206. Based on substrate 110 and compressible sliding thermal interface 120 being inserted into opening 204 of cage 206, compressible sliding thermal interface 120 may be compressed, which may increase a clamping force on substrate 110, and may reduce a thermal boundary resistance between substrate 110 and riding heatsink 208, thereby improving heat dissipation performance. In some implementations, substrate 110 (and/or an electro-optic transceiver thereof) may contact (e.g., conformally contact) riding heatsink 208. In some implementations, substrate 110 may be within a threshold proximity of riding heatsink 208 with one or more intermediate layers of material.

In some implementations, a threshold clamping force between substrate 110 and riding heatsink 208 is increased by a presence of compressible sliding thermal interface 120 relative to another configuration without compressible sliding thermal interface 120. Based on achieving a threshold clamping force, compressible sliding thermal interface 120 may fill interstices between substrate 110 and riding heatsink 208, thereby achieving a threshold thermal conductivity, a threshold thermal boundary resistance, and/or the like. In some implementations, a fill factor for compressible sliding thermal interface 120 when filling interstices between substrate 110 and riding heatsink 208 is greater than a threshold percentage fill factor, thereby increasing a fill factor relative to a bare surface-on-surface contact of rough surfaces of substrate 110 and riding heatsink 208.

In some implementations, the threshold thermal conductivity is at least approximately 1000 Watts per meter Celsius (W/mC). In this way, based on improving the thermal conductivity relative to air-filled interstices, which may have a thermal conductivity of 0.025 W/mC, compressible sliding thermal interface 120 may improve heat transfer between substrate 110 (e.g., as well as a printed circuit board and/or a digital signal processor of an electro-optic transceiver that includes substrate 110) and riding heatsink 208. In some implementations, the threshold thermal boundary resistance is less than approximately 1.5 square inches Kelvin per Watt ($in^2K/W$). In some implementations, the thermal boundary resistance is approximately 0.36 $in^2K/W$. In this case, based on decreasing the thermal boundary resistance from above 1.5 $in^2K/W$ to, for example, 0.36 $in^2K/W$, a pluggable optical module may be associated with an approximately 5 degrees Celsius (° C.) to 6° C. temperature reduction when operating with a 7 Watt (W) DSP.

As indicated above, FIGS. 2A-2D are provided merely as one or more examples. Other examples may differ from what is described with regard to FIGS. 2A-2D.

Figure 3:
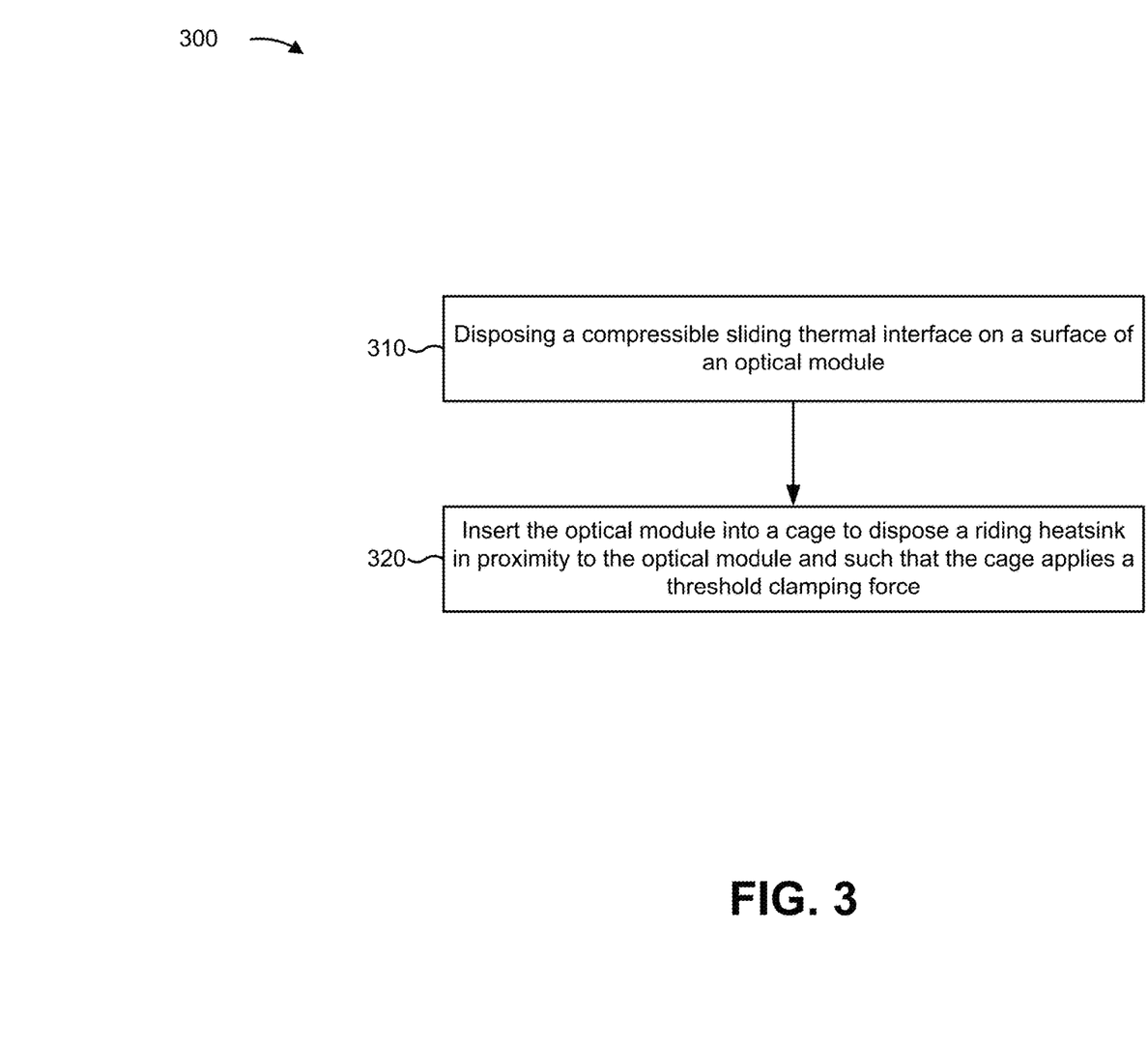
FIG. 3 is a flow chart of an example process for using a pluggable optical module with a compressible sliding thermal interface.

FIG. 3 is a flow chart of an example process 300 for using a compressible sliding thermal interface with a pluggable optical module. In some implementations, one or more process blocks of FIG. 3 may be performed during assembly of an optical communications network.

As shown in FIG. 3, process 300 may include disposing a compressible sliding thermal interface on a surface of an optical module (block 310). For example, the compressible sliding thermal interface may be deposited onto a depression in a substrate of the optical module. In some implementations, the substrate of the optical module may be a housing of the optical module. In some implementations, the optical module may be a pluggable optical module that is to contact a riding heatsink.

As further shown in FIG. 3, process 300 may include inserting the optical module into a cage to dispose a riding heatsink in proximity to the optical module and such that the cage applies a threshold clamping force (block 320). For example, an opening of the cage may be sized to receive the optical module, such that the optical module is clamped by the opening of the cage. In some implementations, the optical module may contact the riding heatsink. Additionally, or alternatively, the optical module may be within a threshold proximity to the riding heatsink without contacting the riding heatsink (e.g., with one or more intermediate layers of material such as the compressible sliding thermal interface, a layer of material of the cage, and/or the like). In this way, based on the compressible sliding thermal interface extending above a surface of the optical module, the compressible sliding thermal interface increases a clamping force applied by the opening of the cage, thereby reducing a thermal boundary resistance and improving performance of a riding heatsink of the cage. Moreover, the clamping force may cause the compressible sliding thermal interface to fill interstices between a surface of the optical module and a surface of the riding heatsink or the cage, thereby reducing a thermal insulation relative to air interstices of a metal-on-metal contact between the surfaces.

Process 300 may include additional implementations, such as any single implementation or any combination of implementations described herein.

Although FIG. 3 shows example blocks of process 300, in some implementations, process 300 may include additional blocks, fewer blocks, different blocks, or differently arranged blocks than those depicted in FIG. 3. Additionally, or alternatively, two or more of the blocks of process 300 may be performed in parallel.

In this way, based on compressible sliding thermal interface 120 protruding from a surface of substrate 110, a clamping force is increased for a pluggable optical module, thereby reducing thermal contact resistance between substrate 110 of the pluggable optical module and riding heatsink 208. Moreover, based on increasing the clamping force and using a compressible, slidable material for compressible sliding thermal interface 120, compressible sliding thermal interface 120 fills interstices between respective surfaces of substrate 110 and riding heatsink 208, thereby decreasing thermal contact resistance. Based on decreasing thermal contact resistance, compressible sliding thermal interface improves heat transfer to riding heatsink 208, thereby improving performance of riding heatsink 208 with respect to controlling a temperature of components of the pluggable optical module.

The foregoing disclosure provides illustration and description, but is not intended to be exhaustive or to limit the implementations to the precise forms disclosed. Modifications and variations may be made in light of the above disclosure or may be acquired from practice of the implementations.

Some implementations are described herein in connection with thresholds. As used herein, satisfying a threshold may, depending on the context, refer to a value being greater than the threshold, more than the threshold, higher than the threshold, greater than or equal to the threshold, less than the threshold, fewer than the threshold, lower than the threshold, less than or equal to the threshold, equal to the threshold, or the like.

Even though particular combinations of features are recited in the claims and/or disclosed in the specification, these combinations are not intended to limit the disclosure of various implementations. In fact, many of these features may be combined in ways not specifically recited in the claims and/or disclosed in the specification. Although each dependent claim listed below may directly depend on only one claim, the disclosure of various implementations includes each dependent claim in combination with every other claim in the claim set.

No element, act, or instruction used herein should be construed as critical or essential unless explicitly described as such. Also, as used herein, the articles "a" and "an" are intended to include one or more items, and may be used interchangeably with "one or more." Furthermore, as used herein, the term "set" is intended to include one or more items (e.g., related items, unrelated items, a combination of related and unrelated items, etc.), and may be used interchangeably with "one or more." Where only one item is intended, the phrase "only one" or similar language is used. Also, as used herein, the terms "has," "have," "having," or the like are intended to be open-ended terms. Further, the phrase "based on" is intended to mean "based, at least in part, on" unless explicitly stated otherwise.

What is claimed is:

1. An optical device that is configured to be slidably engaged with a heatsink, the optical device comprising:
   a substrate; and
   a sliding thermal interface disposed on the substrate,
      wherein the sliding thermal interface includes a flexible interface structure that encloses an interface filling material, and
      wherein the sliding thermal interface is configured to be compressed with a threshold clamping force when the optical device slidably engages the heatsink.

2. The optical device of claim 1, wherein the substrate includes a depression, and the sliding thermal interface is disposed in the depression.

3. The optical device of claim 1, wherein the flexible interface structure is a metal enclosure, and the interface filling material is a conductive fluid.

4. The optical device of claim 1, wherein the substrate is a surface of one of:
   a wavelength selective switch,
   an amplifier,
   a transmitter,
   a receiver, or
   a digital signal processor.

5. The optical device of claim 1, wherein the sliding thermal interface is configured to fill interstices between the substrate and the heatsink when the optical device slidably engages the heatsink.

6. The optical device of claim 1, wherein the sliding thermal interface is associated with a thermal conductivity of greater than 1000 Watts per meter Celsius (W/mC).

7. An optical module configured to removably engage another component, the optical module comprising:
   a substrate,
   a thermal interface disposed on the substrate,
      wherein the thermal interface includes an outer interface structure that encloses a filling material, and
      wherein, when the optical module removably engages the other component, the thermal interface is configured to fill interstices between the substrate and the component to achieve a threshold thermal boundary resistance between the optical module and the other component.

8. The optical module of claim 7, wherein the substrate includes a depression, and the thermal interface is disposed in the depression.

9. The optical module of claim 7, wherein the thermal interface is configured to be compressed by a threshold clamping force when the optical module is removably engaged with the other component.

10. The optical module of claim 7, wherein the filling material is a carbon fiber material or a carbon nano-tube material.

11. The optical module of claim 7, wherein threshold thermal boundary resistance is between approximately 0.36 square inches Kelvin per Watt ($in^2K/W$) to approximately 1.5 $in^2K/W$.

12. An electro-optic transceiver, comprising:
   a substrate that is configured to be removably inserted into a cage; and
   a thermal interface disposed on an upper surface of the substrate,
      wherein the thermal interface includes an outer structure that encloses a filling material, and
      wherein the thermal interface is configured to fill interstices within the cage when the substrate is removably inserted into the cage.

13. The electro-optic transceiver of claim 12, wherein the thermal interface is disposed over a portion of the substrate that is to align to a riding heatsink when the substrate is removably inserted into the cage.

14. The electro-optic transceiver of claim 13, wherein the riding heatsink forms a section of the cage.

15. The electro-optic transceiver of claim 12, wherein the substrate includes a depression of a depth of between approximately 100 micrometers and 2000 micrometers, and the thermal interface is disposed in the depression.

16. The electro-optic transceiver of claim 12, wherein a height of the thermal interface above the upper surface of the substrate is greater than 0 micrometers and less than approximately 2000 micrometers.

17. The electro-optic transceiver of claim 12, wherein a height of the thermal interface above the upper surface of the substrate is less than 100 micrometers.

18. The electro-optic transceiver of claim 12, wherein a width of the thermal interface is between approximately 5 millimeters (mm) and 50 mm.

19. The electro-optic transceiver of claim 12, wherein the outer structure is metal.

20. The electro-optic transceiver of claim 12, wherein the filling material is a conductive fluid.

* * * * *